United States Patent [19]
Soh

[11] Patent Number: 5,347,146
[45] Date of Patent: Sep. 13, 1994

[54] POLYSILICON THIN FILM TRANSISTOR OF A LIQUID CRYSTAL DISPLAY

[75] Inventor: Hoe S. Soh, Kwacheon, Rep. of Korea

[73] Assignee: Goldstar Co., Ltd., Seoul, Rep. of Korea

[21] Appl. No.: 998,533

[22] Filed: Dec. 30, 1992

[30] Foreign Application Priority Data

Dec. 30, 1991 [KR] Rep. of Korea ............... 25534/1991

[51] Int. Cl.[5] ................ H01L 27/01; H01L 27/13; H01L 29/48
[52] U.S. Cl. ........................ 257/59; 257/57; 257/70; 257/72; 257/351; 257/352; 257/354
[58] Field of Search ............ 257/57, 61, 66, 70, 257/347, 351, 352, 59, 72, 354

[56] References Cited

U.S. PATENT DOCUMENTS

| | | | |
|---|---|---|---|
| 4,849,797 | 7/1989 | Ukai et al. | 257/57 |
| 4,851,363 | 3/1988 | Troxell et al. | 437/40 |
| 4,864,376 | 9/1989 | Aoki et al. | 257/61 |
| 4,951,113 | 8/1990 | Huang et al. | 257/61 |

FOREIGN PATENT DOCUMENTS

| | | | |
|---|---|---|---|
| 61-119079 | 6/1986 | Japan . | |
| 61-127118 | 6/1986 | Japan . | |
| 61-198678 | 9/1986 | Japan | 257/57 |
| 62-73660 | 4/1987 | Japan | 257/67 |
| 63-47981 | 2/1988 | Japan | 257/352 |
| 63-190385 | 8/1988 | Japan | 257/61 |
| 1-61061 | 3/1989 | Japan | 257/61 |
| 1-276671 | 11/1989 | Japan | 257/57 |

*Primary Examiner*—Ngan Van Ngo
*Attorney, Agent, or Firm*—John P. White

[57] ABSTRACT

A thin film transistor comprising a multi-layer structure including an amorphous silicon layer and a metal layer both forming source and drain regions. The source and drain regions have opposite exposed edges with a slant shape. An active semiconductor layer is disposed at a channel region defined between the source region and the drain region so that it is overlapped with the upper surface portions of the source and drain regions adjacent to their edges faced to each other. In a CMOS type thin film transistor, its n type TFT has a gate overlapped with the source and drain regions and its p type TFT has a gate offsetted from the source and drain region.

10 Claims, 5 Drawing Sheets

F I G. 3
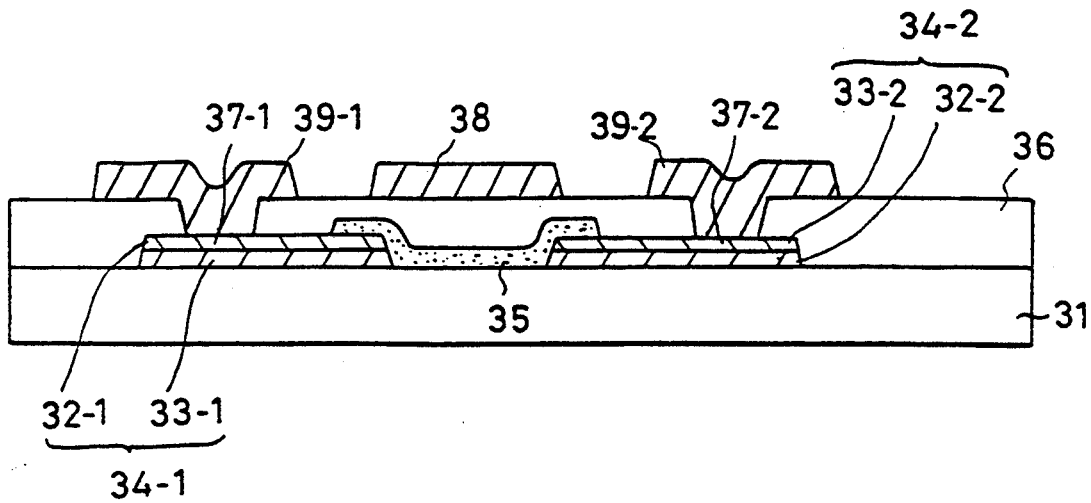
F I G. 4
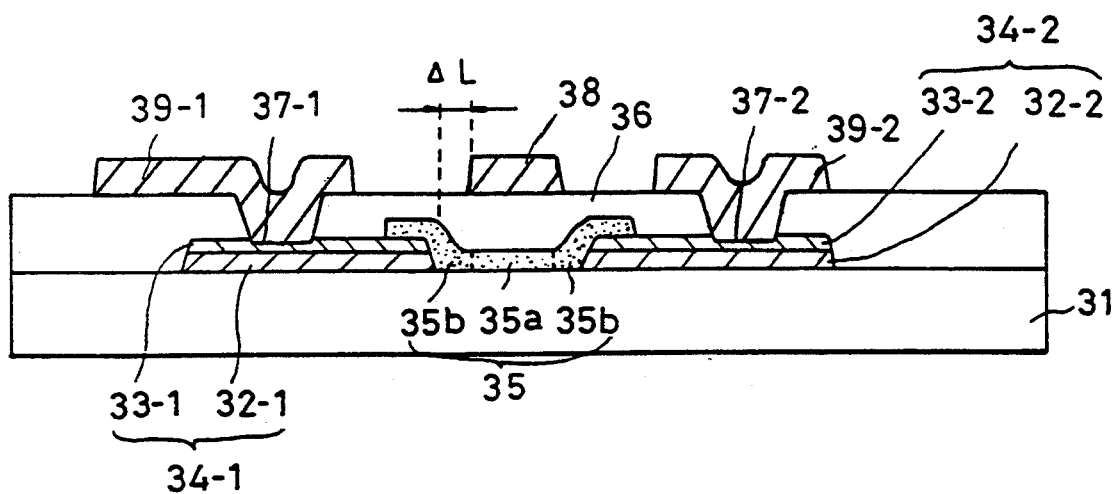
F I G. 5
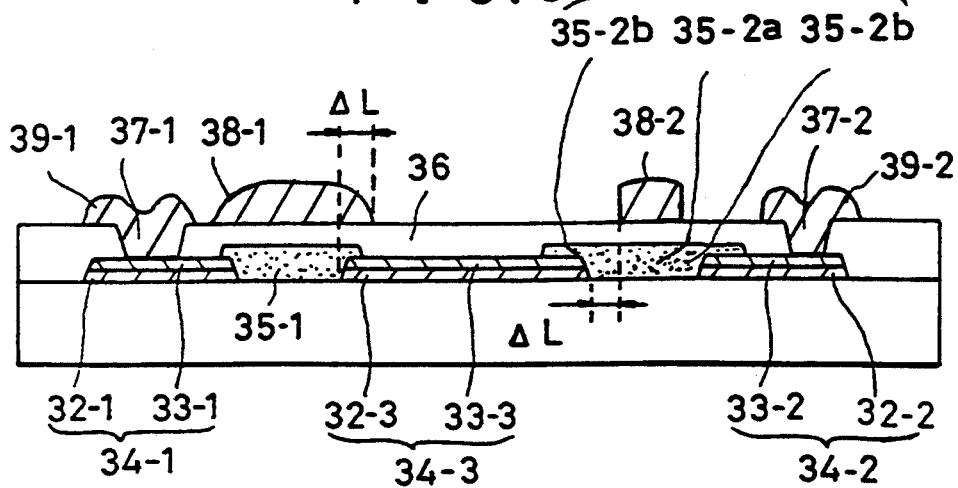

F I G. 6
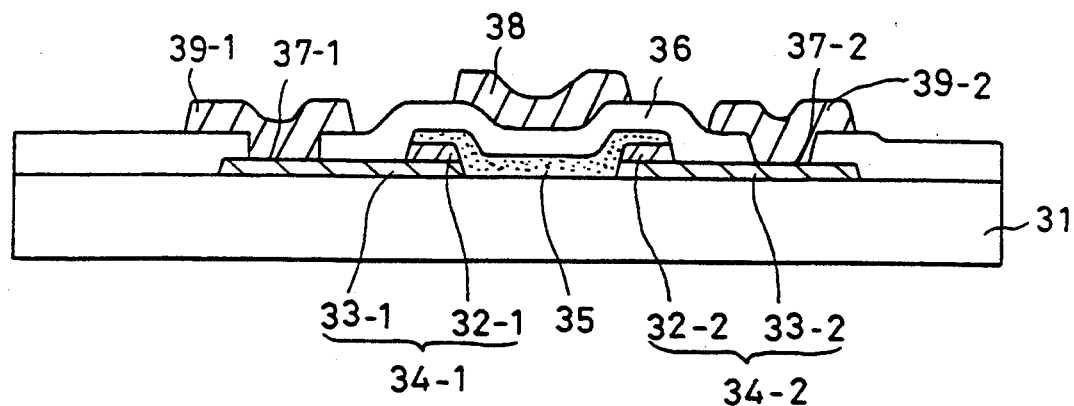
F I G. 7
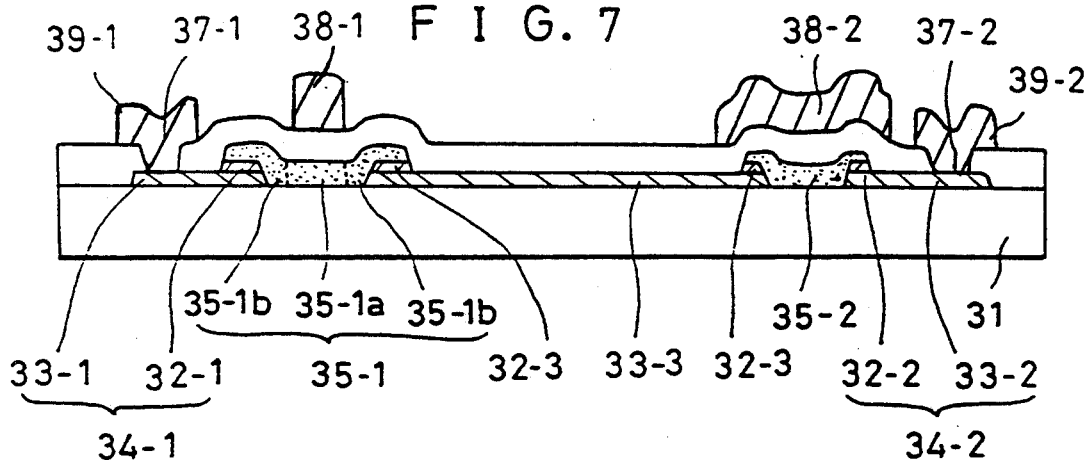
F I G. 8
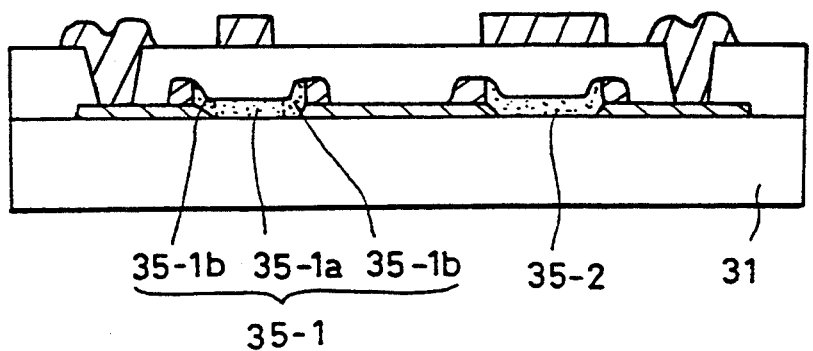

POLYSILICON THIN FILM TRANSISTOR OF A LIQUID CRYSTAL DISPLAY

BACKGROUND OF THE INVENTION

1 Field of the Invention

The present invention relates to switching devices for flat displays, and more particularly to polysilicon thin film transistors applied to liquid crystal displays.

2. Description of the Prior Art

Polysilicon thin film transistors (TFTs) have a polysilicon semiconductor layer serving as a conduction passage between a source and a drain and control current flowing between the source and drain to serve as switches.

Recently, liquid crystal displays (LCDs) have made rapid progresses as new type flat displays. In particular, in cases of LCDs of a dot matrix displaying type in which a TFT is provided at each pixel, for displaying a large character or picture, amorphous silicon TFTs have been used as switching devices, so as to obtain a better quality of LCD image.

For displaying such a large character, however, the pixel density of LCD should be increased. Such an increase in pixel density results in an increase in the density of wires connected to drive circuits. For solving these problems, there has been a proposal of forming both LCD drive circuit and switching device on a glass substrate or a quartz substrate, by using polysilicon TFT having a high electron mobility.

Where the quartz substrates are used, the polysilicon thin films can be treated at a high temperature of not less than 600° C. In the case of using the glass substrates, however, the treating temperature is limited to a level of less than 600° C. The polysilicon thin films of TFTs can be manufactured not only by using a low pressure chemical vapor deposition (LPCVD) method, but also by depositing an amorphous silicon layer and then heat treating the amorphous silicon layer using a laser annealing method or other similar method. Otherwise, the polysilicon thin films may be made without any heat treatment, by using a special deposition method.

Referring to FIG. 1, there is illustrated an example of a conventional staggered polysilicon TFT.

As shown in FIG. 1, the conventional polysilicon TFT comprises an insulating substrate 11 having a channel region 12', source/drain regions 15 disposed at opposite sides of the channel region 12', a gate region disposed over the channel region 12' and isolated from the channel region 12' by a gate insulating film 13, contacts 17 and 18 disposed over the channel region 12' and the source/drain regions 15, respectively, a gate electrode 19 disposed above the channel region 12' and isolated from the channel region 12' by an insulating film 16, and source/drain electrodes 20 disposed over the source/drain regions 15 and isolated from the gate electrode by insulating films 13 and 16. The gate electrode 19 and the source/drain electrodes 20 are connected with the gate region 14 and the source/drain regions 15 by the contacts 17 and 18, respectively.

FIGS. 2a to 2e are schematic sectional views illustrating a method of making the polysilicon TFT with the conventional structure shown in FIG. 1.

In accordance with the method, first, a undoped polysilicon film 12 is deposited over the insulating substrate 11, using the LPCVD method, as shown in FIG. 2a. Thereafter, the polysilicon film 12 is subjected to a patterning using photolithography, so as to remove its unnecessary portion and thus form a pattern.

Over the resultant. entire exposed surface, the gate insulating film 13 is deposited using the LPCVD method, the plasma enhanced chemical vapor deposition (PECVD) method or the ECR method, to have a thickness of 1000 Å to 4,000 Å, as shown in FIG. 2b. Over the gate insulating film 13 is then deposited a phosphorous-doped polysilicon film which is, in turn, subjected to a patterning using a photoetching process, so as to form the gate region 14.

Using the gate region 14 as a mask, phosphorous (P) ions are implanted in the undoped polysilicon film 12 so that the source/drain regions 15 are formed in a self-aligned manner. At this time, the undoped portion of polysilicon film 12 disposed beneath the gate region 14 and between the source/drain-regions 15 forms the channel region 12'.

As shown in FIG. 2c, an insulating film 16 is then deposited over the resultant entire exposed surface. The insulating film 16 is subjected to a photoetching, so as to remove portions of insulating films 13 and 16 disposed over the gate region 14 and the source drain regions 15 and thus a form the contacts 17 and 18.

Finally, the gate metal electrode 19 and the source/drain metal electrodes 20 are formed over the contacts 17 and 18 such that they are in contact with the gate region 14 and the source/drain regions 15, respectively.

For making CMOS type TFTs, however, the conventional method should also comprise an ion implantation process involving at least two steps of implanting n type ions and implanting p type ions. Even in a doped polysilicon layer, its serial resistance is increased, since its thickness becomes thinner.

Accordingly, the conventional method also involves an ion implantation for additionally implanting a large quantity of ions in source/drain regions. As the number of ion implantation steps is increased as mentioned above, the number of photomasking steps is also increased, thereby causing the yield of TFTs to be decreased.

SUMMARY OF THE INVENTION

Therefore, an object of the invention is to provide a polysilicon thin film transistor having source/drain region provided by a metal layer, thereby achieving an improvement in electric signal characteristic thereof.

Another object of the invention is to provide a CMOS type polysilicon thin film transistor capable of constructing a LCD drive circuit.

Another object of the invention is to provide a polysilicon thin film transistor capable of having a sufficient process parameter tolerance, even in a case of using a very thin semiconductor layer and a doped layer.

In accordance with one aspect of the invention, the present invention provides a thin film transistor comprising: a substrate; a first semiconductor layer formed over one side portion of an upper surface of the substrate and provided with at least one exposed edge, the first. semiconductor layer also having a contact at its upper surface; a second semiconductor layer formed over the other side portion of the upper surface of the substrate and provided with at least one exposed edge, the first semiconductor layer also having a contact at its upper surface; an active semiconductor layer formed over the upper surface of the substrate such that it is overlapped with upper surface portions of the first and second semiconductor layers, the upper surface portions being adjacent to the facing edges of the first and second semiconductor layers; a gate insulating film formed over the resultant entire exposed surface of the substrate and all layers formed thereon, except for the contacts of the first and second semiconductor layers; a first electrode formed over the gate insulating film and connected with the first semiconductor layer through the contact of the first semiconductor layer; a second electrode formed over the gate insulating film and connected with the second semiconductor layer through the contact of the second semiconductor layer; and a gate electrode formed over the gate insulating film and having a width larger than the width between the first and second semiconductor layers.

In accordance with another aspect, the present invention provides a thin film transistor comprising: a substrate; a first semiconductor layer formed over one side portion of an upper surface of the substrate and provided with at least one exposed edge, the first semiconductor layer also having a contact at its upper surface; a second semiconductor layer formed over the other side portion of the upper surface of the substrate and provided with at least one exposed edge, the first semiconductor layer also having a contact at its upper surface; a third semiconductor layer formed over the upper surface of the substrate between both side portions thereof and provided with at least one exposed edge; a first active semiconductor layer formed over the upper surface of the substrate such that it is overlapped with upper surface portions of the first and third semiconductor layers, the upper surface portions being adjacent to the facing edges of the first and third semiconductor layers; a second active semiconductor layer formed over the upper surface of the substrate such that it is disposed adjacent to the facing edges of the second and third semiconductor layers; a gate insulating film formed over the resultant entire exposed surface of the substrate and all layers formed thereon, except for the contacts of the first and second semiconductor layers; a first electrode formed over the gate insulating film and connected with the first semiconductor layer through the contact of the first semiconductor layer; a second electrode formed over the gate insulating film and connected with the second semiconductor layer through the contact of the second semiconductor layer; a first gate electrode formed over the gate insulating film and having a width smaller than the width between the first and third semiconductor layers; and a second gate electrode formed over the gate insulating film such that it is overlapped at its opposite edges with both the second and third semiconductor layers by a predetermined width.

BRIEF DESCRIPTION OF THE DRAWINGS

Other objects and aspects of the invention will become apparent from the following description of embodiments with reference to the accompanying drawings in which:

FIG. 3 is a schematic sectional view of a thin film transistor in accordance with a first embodiment of the present invention;

FIG. 4 is a schematic sectional view of a thin film transistor in accordance with a second embodiment of the present invention;

FIG. 5 is a schematic sectional view of a thin film transistor in accordance with a third embodiment of the present invention;

FIG. 6 is a schematic sectional view of a thin film transistor in accordance with a fourth embodiment of the present invention;

FIG. 7 is a schematic sectional view of a thin film transistor in accordance with a fifth embodiment of the present invention;

FIG. 8 is a schematic sectional view of a thin film transistor in accordance with a sixth embodiment of the present invention.

DETAILED DESCRIPTION OF THE PREFERRED EMBODIMENTS

Figure 1:
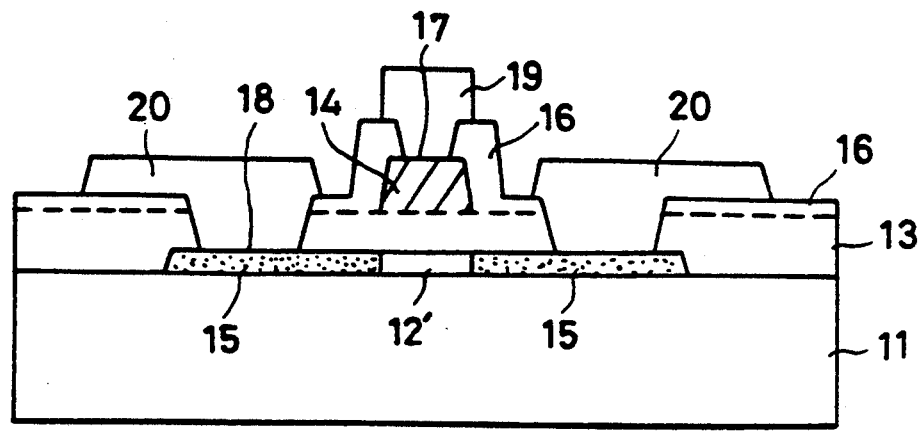
FIG. 1 is a schematic sectional view of a conventional thin film transistor.
Figure 2A:
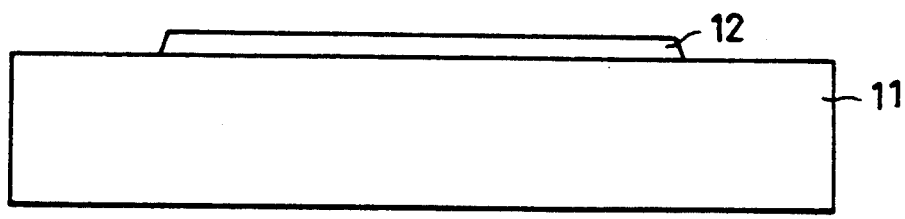
FIGS. 2a to 2e are schematic sectional views illustrating a method of making the polysilicon thin film transistor with the conventional structure shown in FIG. 1.
Figure 2B:
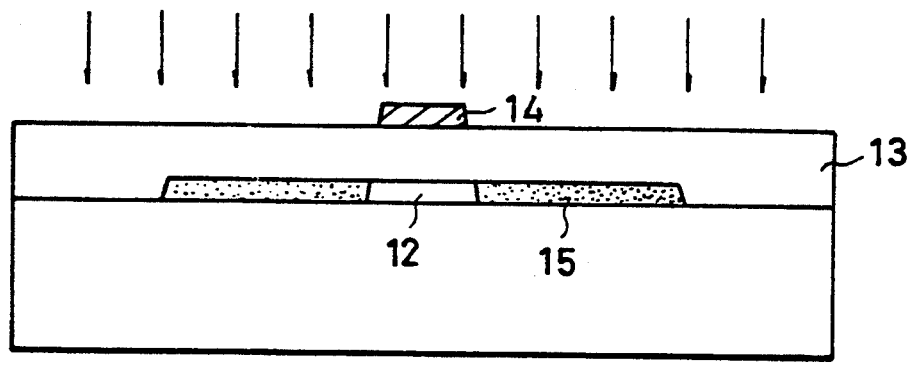
Figure 2C:
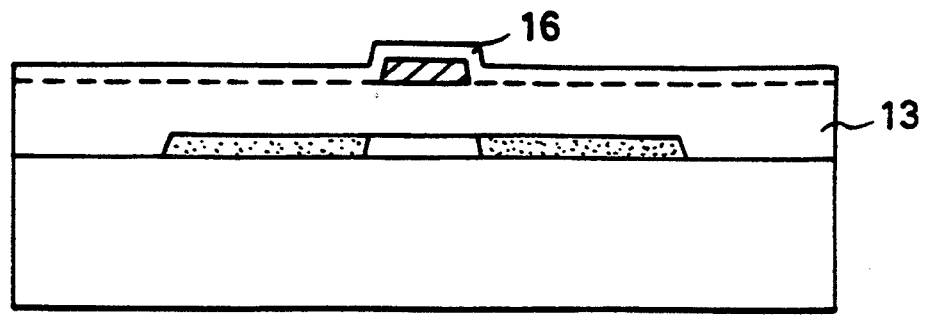
Figure 2D:
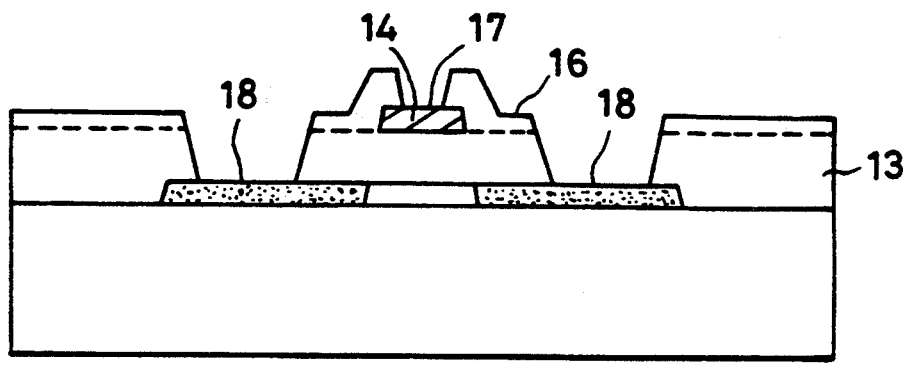
Figure 2E:
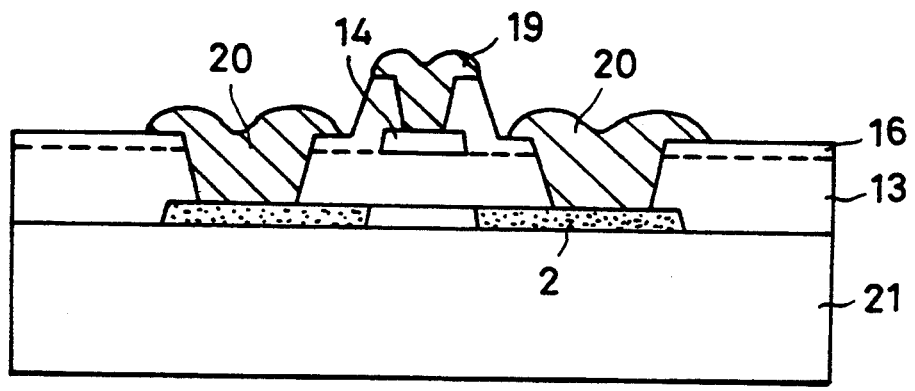

Referring to FIG. 3, there is illustrated a thin film transistor in accordance with a first embodiment of the present invention.

As shown in FIG. 3, the thin film transistor of the first embodiment is of a multi-layer structure comprising an insulating substrate 31, an amorphous silicon layer 32 formed over the insulating substrate 31 and a metal layer 33 formed over the amorphous silicon layer 32. The thin film transistor also comprises a source region 34-1 arid a drain region 34-2, each region having opposite exposed edges with a slant shape. An active semiconductor layer 35 is also disposed at a channel region defined between the source region 34-1 and the drain region 34-2. The active semiconductor layer 35 is overlapped with the upper surface portions of the source region 34-1 and drain region 34-2 adjacent to their edges faced to each other. Over the source region 34-1 and the drain region 34-2, a pair of contacts 37-1 and 37-2 are defined, respectively. The thin film transistor also comprises a source electrode 39-1 and a drain electrode 39-2 isolated from the active semiconductor layer 35 by an insulating layer 36 and connected with the source region 34-1 and drain region 34-2 by the contacts 37-1 and 37-2, respectively. A gate electrode 38 is disposed over the active semiconductor layer 35 such that it is isolated from the active semiconductor layer 35 by the insulating film 36.

Now, a procedure for manufacturing the thin film transistor with the above-mentioned structure shown in FIG. 3 will be described.

First, over the insulating substrate 31, an amorphous silicon layer 32 is deposited using the PECVD method. Subsequently, a layer 33 of a metal such as molybdenum or tungsten is deposited. The amorphous silicon layer 32 and metal layer 33 are subjected to a patterning using a photoetching method, so as to form the source region 34-1 and the drain region 34-2. The patterning is carried out so that the exposed edges of amorphous silicon layer 32 and metal layer 33 have a slant shape.

Thereafter, the active semiconductor layer 35 is formed over the resultant entire exposed surface, to have a thickness of 100 Å to 2,000 Å. The formation of active semiconductor layer 35 may be achieved by depositing an amorphous layer and then heat treating the amorphous layer using laser beam, to transform it into a polysilicon layer. Otherwise, the formation of active semiconductor layer 35 may be achieved by directly depositing a polysilicon layer without using any subsequent heat treatment.

Thereafter, the active semiconductor layer 35 is patterned using a photoetching method so that it is overlapped with the upper surface portions of the source region 34-1 and drain region 34-2 adjacent to their edges faced to each other.

Over the resultant entire exposed surface is then deposited the gate insulating layer 36 which is, in turn, subjected to a patterning for removing its portions disposed over the source region 34-1 and drain region 34-2, so as to define the contacts 37-1 and 37-2 over the source region 34-1 and drain region 34-2.

Thereafter, the gate electrode 38 is formed over the gate insulating film 36 such that it is disposed above the active semiconductor layer 35. The gate electrode 38 is isolated from the active semiconductor layer 35 by the gate insulating film 36. Over the gate insulating film 36, the source electrode 39-1 and drain electrode 39-2 are also formed so that they are in contact with the source region 34-1 and drain region 34-2 through the contacts 37-1 and 37-2.

For making better the boundary surfaces between the active semiconductor layer 35 and the gate insulating film 36, the formation of gate insulating film 36 is achieved by depositing $SiO_2$ according to the ECR method or according to the LPCVD method or the sputtering method.

FIG. 4 is a schematic sectional view of a thin film transistor in accordance with a second embodiment of the present invention.

The thin film transistor of the second embodiment has a structure similar to the structure of the first embodiment. In accordance with the second embodiment, however, the gate electrode 38 is formed over the plate insulating film 36 so that its opposite edges are horizontally spaced from corresponding facing edges of the source region 34-1 and drain region 34-2, respectively, by a distance L.

In similar to the first embodiment, the active semiconductor layer 35 of the second embodiment is formed so that it is overlapped with the upper surface portions of the source region 34-1 and drain region 34-2 adjacent to their edges faced to each other. In the second embodiment, however, the active semiconductor layer 35 comprises a polysilicon layer 35a disposed beneath the gate electrode 38 and having the same width as the gate electrode 38 and a pair of ion implantation layers 35b implanted with phosphorous ions and disposed at opposite sides of the polysilicon layer 35a, respectively. The ion implantation is achieved using the gate electrode 38 as a mask.

That is, the polysilicon layer 35a of the active semiconductor layer 35 is formed so that its opposite edges are horizontally spaced from corresponding facing edges of the source region 34-1 and drain region 34-2, respectively, by a distance L.

The thin film transistor of FIG. 4 has a structure capable of reducing the quantity of leakage current at OFF state while maintaining high ON current.

Where the thin film transistor of FIG. 4 has a structure with the active semiconductor layer 35 comprising only the polysilicon layer 35a, it has a characteristic capable of being operated even at high voltage.

Referring to FIG. 5, there is illustrated a thin film transistor in accordance with a third embodiment of the present invention. In accordance with this embodiment, both of a n type thin film transistor and a p type thin film transistor are formed on a single substrate, so as to obtain a CMOS type thin film transistor. In accordance with this embodiment, the CMOS type thin film transistor is made by an ion implantation process involving a single boron ion implantation without an addition of a photomasking process.

As shown in FIG. 5, the CMOS type thin film transistor is of a multi-layer structure comprising an insulating substrate 31, an $n^+$ type amorphous silicon layer 32 formed over the insulating substrate 31 and a metal layer formed over the $n^+$ type amorphous silicon layer 32. The CMOS type thin film transistor also comprises first to three semiconductor layers 34-1, 34-2 and 34-3, each layer having opposite exposed edges with a slant shape. A first active semiconductor layer 35-1 is disposed at a channel region defined between the first semiconductor layer 34-1 and the third semiconductor layer 34-3. The first active semiconductor layer 35-1 is in contact with the facing slant edges of the first and third semiconductor layers 34-1 and 34-3. A second active semiconductor layer 35-2 is also disposed at a channel region defined between the second semiconductor layer 34-2 and the third semiconductor layer 34-3. The second active semiconductor layer 35-2 is overlapped with the upper surface portions of the second semiconductor layer 34-2 and the third semiconductor layer 34-3 adjacent to their edges faced to each other. Above the first active semiconductor layer 35-1, a first gate electrode 38-1 is formed to be isolated from the first active semiconductor layer 35-1 by a gate insulating layer 36. The first gate electrode 38-1 is also overlapped with the first active semiconductor layer 35-1 by a width corresponding a distance L' that opposite edges thereof is horizontally spaced from corresponding facing edges of the first and third semiconductor layers 34-1 and 34-3, respectively. Above the second active semiconductor layer 35-2, a second gate electrode 38-2 is formed to be isolated from the second active semiconductor layer 35-2 by the gate insulating layer 36. The second gate electrode 38-2 has opposite edges horizontally spaced from corresponding facing edges of the second and third semiconductor layers 34-2 and 34-3, respectively, by a distance L. Over the first semiconductor layer 34-1 and the second semiconductor layer 34-2, a pair of contacts 37-1 and 37-2 are defined, respectively. The CMOS type thin film transistor also comprises a first electrode 39-1 and a second electrode 39-2 formed over the gate insulating layer 36 to be connected with the first semiconductor layer 34-1 and the second semiconductor layer 34-2 by the contacts 37-1 and 37-2, respectively.

The first semiconductor layer 34-1 serves as a source region of the n type thin film transistor, whereas the third semiconductor layer 34-3 serves as drain regions of the n type and p type thin film transistors. On the other hand, the second semiconductor layer 34-2 serves as a source of the p type thin film transistor.

The first electrode 39-1 serves as a source electrode of the n type thin film transistor and the second electrode 39-2 serves as a source electrode of the p type thin film transistor.

In the case of the n type thin film transistor, the active semiconductor layer 35-1 comprises a single polysilicon film. In this case, the gate electrode 38-1 is also overlapped with the first active semiconductor layer 35-1 by a width corresponding a distance L' that opposite edges thereof is horizontally spaced from corresponding facing edges of the source region 34-1 and the drain region 34-3, respectively.

On the other hand, in the case of the p type thin film transistor, the active semiconductor layer 35-2 comprises a polysilicon layer 35-2a disposed at a channel region beneath a gate and a pair of ion implantation layers 35-2b disposed at opposite sides of the polysilicon layer 35-2a, respectively. In this case, The plate electrode 38-2 is formed above the polysilicon layer 35-2a, to be offsetted from both the source region 34-3 and the drain region 34-2, by a distance L.

FIGS. 9a to 9d are schematic sectional views illustrating a method of making the CMOS type thin film transistor with the above-mentioned structure according to the present invention. Now, the method will be described, in conjunction with FIGS. 9a to 9d.

Figure 9A:
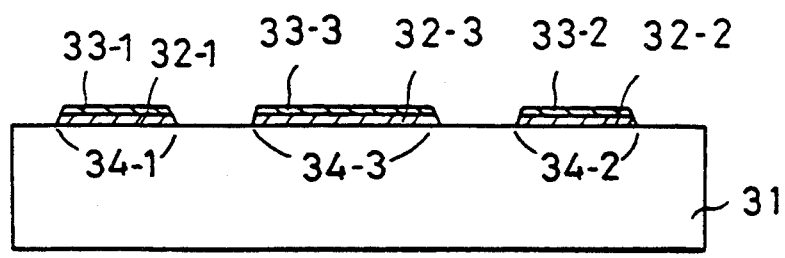
FIGS. 9a to 9d are schematic sectional views illustrating a method of making the thin film transistor according to the third embodiment of the present invention.

First, over the insulating substrate 31 is formed an amorphous silicon layer 32 containing a large amount of phosphorous and a metal layer 33, in this order, as shown in FIG. 9a. The amorphous silicon layer 32 and metal layer 33 are subjected to a patterning using a photoetching method, so as to form the first semiconductor layer 34-1 serving as the source region of the n type TFT, the second semiconductor layer 34-2 serving as the source region of the p type TFT and the third semiconductor layer 34-3 serving as drain regions of both the n type and p type TFTs. The patterning is carried out so that the exposed edges of amorphous silicon layer 32 and metal layer 33 have a slant shape.

Figure 9B:
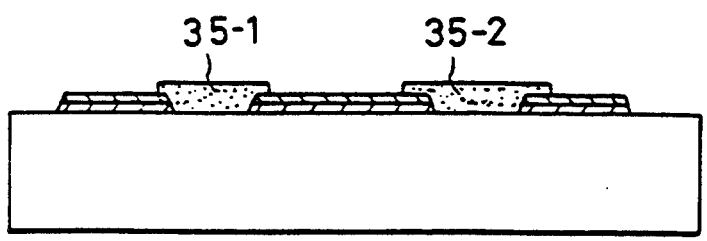

Thereafter, the first active semiconductor layer 35-1 of the n type TFT is formed the channel region defined between the first semiconductor layer 34-1 and the third semiconductor layer 34-3 so that it is in contact with the facing slant edges of the first and third semiconductor layers 34-1 and 34-3, as shown in FIG. 9b. Simultaneously, the second active semiconductor layer 35-2 of the p type TFT is also formed at the channel region defined between the second semiconductor layer 34-2 and the third serniconductor layer 34-3. The second active semiconductor layer 35-2 is overlapped with the upper surface portions of the second semiconductor layer 34-2 and the third semiconductor layer 34-3 adjacent to their edges faced to each other.

Figure 9C:
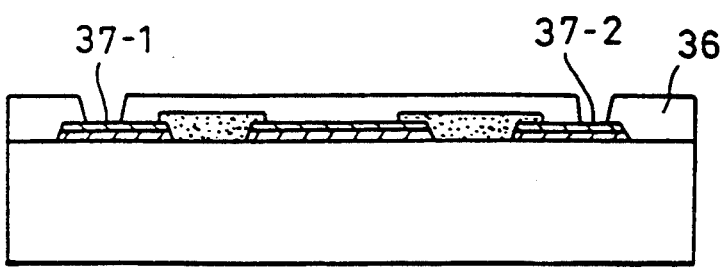

Over the resultant entire exposed surface, the gate insulating layer 36 is then deposited, as shown in FIG. 9c. The gate insulating layer 36 is subjected to a patterning for removing its portions disposed over the first and second semiconductor layers 34-1 and 34-2, so as to define the contacts 37-1 and 37-2 over the first and second semiconductor layers 34-1 and 34-2.

Figure 9D:
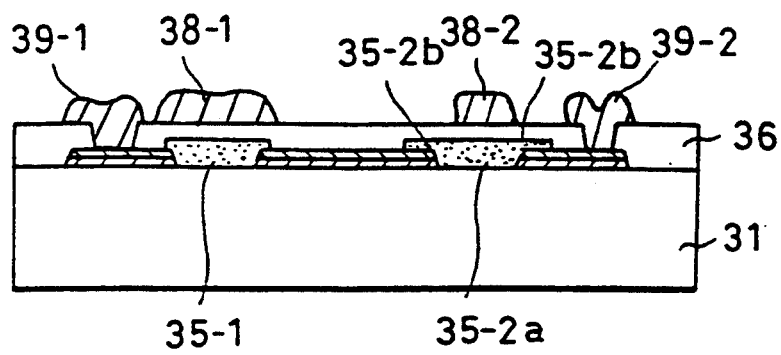

Thereafter, the first electrode 39-1 serving as the source electrode of the n type TFT is formed over the gate insulating layer 36 such that it is connected with the first semiconductor layer 34-1 by the contact 37-1, as shown in FIG. 9d. In similar, the second electrode 39-2 serving as the source electrode of the p type TFT is formed over the gate insulating layer 36 such that it is connected with the second semiconductor layer 34-2 by the contact 37-2.

At the same time, the first gate electrode 38-1 serving as the gate electrode of the n type TFT is formed over the gate insulating layer 36 so that it is overlapped with the first active semiconductor layer 35-1 by a width corresponding a distance L' that opposite edges thereof is horizontally spaced from corresponding facing edges of the first and third semiconductor layers 34-1 and 34-3, respectively. Also, the second gate electrode 38-2 serving as the gate electrode of the p type TFT is formed over the gate insulating layer 36 so that it is offsetted from both the second and third semiconductor layers 34-2 and 34-3, by a distance L. Over the first semiconductor layer 34-1 and the second semiconductor layer 34-2, a pair of contacts 37-1 and 37-2 are defined, respectively. The CMOS type thin film transistor also comprises a first electrode 39-1 and a second electrode 39-2 formed over the gate insulating layer 36 to be connected with the first semiconductor layer 34-1 and the second semiconductor layer 34-2 by the contacts 37-1 and 37-2, respectively.

Thereafter, boron ions are implanted in the active semiconductor layer 35-2, using the gate electrode 39-2 as a mask, so as to form the polysilicon layer 35-2a and the ion implantation layers 35-2b disposed at opposite sides of the polysilicon layer 35-2a. Thus, the CMOS type thin film transistor is obtained.

In the CMOS type thin filmtransistor, OFF current can be lowered at OFF state of gate voltage, by controlling properly the doping concentration of the second and third semiconductor layers 34-2 and 34-3 serving as the source and drain regions of p type TFT.

The same result can be obtained, even in the case of increasing the boron ion doping concentration of the amorphous silicon layer 32 for the first and third semiconductor layers at the step illustrated in FIG. 9a and then implanting phosphorous ions in the first active semiconductor layer 35-1.

Referring to FIG. 6, there is illustrated a thin film transistor in accordance with a fourth embodiment of the present invention. The thin film transistor of this embodiment has a structure similar to that of the first embodiment illustrated in FIG. 3, except that the layer structure for the source/drain regions is different from that of the first embodiment. That is, the layering order of the amorphous silicon layer 32 and the metal layer 33 is reverse to that of the first embodiment. Also, the amorphous silicon layer 32 is provided only at a region where it is in contact with the active semiconductor layer 35.

As shown in FIG. 6, the thin film transistor of the fourth embodiment has a multi-layer structure comprising an insulating substrate 31, a metal layer 33 formed over the insulating substrate 31 and an amorphous silicon layer 32 formed over the metal layer 33 and containing a large amount of phosphorous. The thin film transistor also comprises a source region 34-1 and a drain region 34-2 at the insulating substrate 31, each region having opposite exposed edges with a slant shape. An active semiconductor layer 35 is also disposed at a channel region defined between the source region 34-1 and the drain region 34-2 so that it is overlapped with the upper surface portions of the source region 34-1 and drain region 34-2 adjacent to their edges faced to each other. Over the source region 34-1 and the drain region 34-2, a pair of contacts 37-1 and 37-2 are defined, respectively. The thin film transistor also comprises a source electrode 39-1 and a drain electrode 39-2 connected with the source region 34-1 and drain region 34-2 by the contacts 37-1 and 37-2, respectively. A gate electrode 38 is disposed over the active semiconductor layer 35 such that it is isolated from the active semiconductor layer 35 by the insulating film 36.

Referring to FIG. 7, there is illustrated a thin film transistor in accordance with a fifth embodiment of the present invention. The thin film transistor of this embodiment has a structure similar to that of the third embodiment illustrated in FIG. 5, except that the layer structure for the first to third semiconductor layers 34-1, 34-2 and 34-3 is different from that of the third embodiment. That is, the layering order of the amorphous silicon layer 32 and the metal layer 33 is reverse to that of the third embodiment. Also, the amorphous silicon layer 32 is provided only at a region where it is in contact with the active semi conductor layer 35-1.

This embodiment also has a different active semiconductor structure from the third embodiment. In the case of the n type thin film transistor of this embodiment, the active semiconductor layer 35-1 comprises a polysilicon layer 35-1a and a pair of ion implantation layers 35-1b, as different from the third embodiment. In this case, the gate electrode 38-1 is formed above the polysilicon layer 35-1a, to be offsetted from both the first and third semiconductor layers 34-1 and 34-3 by a predetermined distance. On the other hand, in the case of the p type thin film transistor of the fifth embodiment, the active semiconductor layer 35-2 comprises a single polysilicon film. In this case, the gate electrode 38-2 is overlapped with both the second and third semiconductor layers 34-2 and 34-3.

As shown in FIG. 7, the thin film transistor is of a multi-layer structure comprising an insulating substrate 31, a metal layer 33 formed over the insulating substrate 31 and an amorphous silicon layer 32 formed over the metal layer 33 and containing a large amount of phosphorous. The CMOS type thin film transistor also comprises first to three semiconductor layers 34-1, 34-2 and 34-3. A first active semiconductor layer 35-1 which comprises a polysilicon layer 35-1a and boron ion implantation layers 35-1b disposed at opposite sides of the polysilicon layer 35-1a is disposed at a channel region defined between the first and third semiconductor layers 34-1 and 34-3 so that the polysilicon layer 35-1a is offsetted from both the first and third semiconductor layers 34-1 and 34-3. A second active semiconductor layer 35-2 is disposed at a channel region defined between the second and third semiconductor layers 34-2 and 34-3 so that it is overlapped with the amorphous silicon layers on the second semiconductor layer 34-2 and the third semiconductor layer 34-3. Above the polysilicon layer 35-1a of the first active semiconductor layer 35-1, a first gate electrode 38-1 is formed to be isolated from the first active semiconductor layer 35-1 by a gate insulating layer 36. The first gate electrode 38-1 is also offsetted from the polysilicon layer 35-1a by a predetermined width. Above the second active semiconductor layer 35-2, a second gate electrode 38-2 is formed to be isolated from the second active semiconductor layer 35-2 by the gate insulating layer 36. The second gate electrode 38-2 is overlapped with both the second and third semiconductor layers 34-2 and 34-3 between which the second active semiconductor layer 35-2 is disposed. Over the first and second semiconductor layers 34-1 and 34-2, a pair of contacts 37-1 and 37-2 are defined, respectively. The thin film transistor also comprises a first electrode 39-1 for a source electrode of n type TFT and a second electrode 39-2 for a source electrode of p type TFT formed over the gate insulating layer 36 to be connected with the first semiconductor layer 34-1 and the second semiconductor layer 34-2 by the contacts 37-1 and 37-2, respectively.

On the other hand, FIG. 8 is a schematic sectional view of a thin film transistor in accordance with a sixth embodiment of the present invention. This embodiment has a different active semiconductor structure from the fifth embodiment. In the case of the n type thin film transistor of this embodiment, the active semiconductor layer 35-1 is disposed within the channel region, so as not to be overlapped with the first and third semiconductor layers 34-1 and 34-3, as different from the third embodiment. In the case of the p type thin film transistor, the active semiconductor layer 35-2 is also disposed within the channel region, so as not to be overlapped with the second and third semiconductor layers 34-2 and 34-3. In this case, the gate electrode 38-2 is disposed within the channel region, so as not to be overlapped with both the second and third semiconductor layers 34-2 and 34-3.

As apparent from the above description, the present invention makes it possible to manufacture CMOS type thin film transistors for LCD drive circuits as well as LCD switching devices, with the reduced number of photomasks. The present invention also reduces the number of ion implantation steps and the number of photoetching steps, thereby enabling the manufacture cost to be reduced and the yield to be improved. In accordance with the present invention, the source/-drain regions are provided by a metal layer, thereby enabling the TFT electric signal characteristic to be improved.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A thin film transistor comprising:
   a substrate;
   a first semiconductor layer formed over one side portion portion of an upper surface of the substrate and provided with at at least one exposed edge, the first semiconductor layer also having a contact at its upper surface;
   a second semiconductor layer formed over the other side portion of the upper surface of the substrate and provided with at least one exposed edge, the second semiconductor layer also having a contact at its upper surface;
   a third semicondcutor layer formed over the upper surface of the substrate between both side portions thereof and provided with at least one exposed edge;
   a first active semiconductor layer formed over the upper surface of the substrate such that it is disposed adjacent to the facing edges of the first and third semiconductor layers;
   a second active semiconductor layer formed over the upper surface of the substrate such that it is overlapped with upper surface portions of the second and third semiconductor layers, the upper surface portions being adjacent to the facing edges of the second and third semicondcutor layers;
   a gate insulating film formed over the resultant entire exposed surface of the substrate and all layers formed thereon, except for the contacts of the first and second semiconductor layers;
   a first electrode formed over the gate insulating film and connected with the first semiconductor layer through the contact of the first semiconductor layer;
   a second electrode formed over the gate insulating film and connected with the second semiconductor layer through the contact of the second semiconductor layer;

a first gate electrode formed over the gate insulating film such that it is overlapped at its opposite edges with both the first and third semiconductor layers by a predetermined width; and a second gate electrode formed over the gate insulating film and having a width smaller than the width between the second and third semiconductor layers, the second gate electrode being offset at its opposite edges with both the second and third semiconductor layers by a predetermined width.

2. A thin film transistor in accordance with claim 1, wherein the exposed edges of the first, second and third semiconductor layers have a slant shape.

3. A thin film transistor in accordance with claim 1, wherein each of the first, second and third semiconductor layers comprises an amorphous silicon layer of a first conductivity type formed over the substrate and a metal layer formed over the amorphous silicon layer and provided with a contact.

4. A thin film transistor in accordance with claim 1, wherein the first active semiconductor layer is comprised of a single polysilicon film.

5. A thin film transistor in accordance with claim 1, wherein the second active semiconductor layer comprises a pair of ion implantation layers of a second conductivity type overlapped with the second and third semiconductor layers, respectively, and a polysilicon layer formed between the ion implantation layers and having a width identical to a width of the second gate electrode.

6. A thin film transistor comprising:

a substrate;

a first semiconductor layer formed over one side portion of an upper surface of the substrate and provided with at least one exposed edge, the first semiconductor layer also having a contact at its upper surface;

a second semiconductor layer formed over the other side portion of the upper surface of the substrate and provided with at least one exposed edge, the second semiconductor layer also having a contact at its upper surface;

a third semiconductor layer formed over the upper surface of the substrate between both side portions thereof and provided with at least one exposed edge;

a first active semiconductor layer formed over the upper surface of the substrate such that it is overlapped with upper surface portions of the first and third semiconductor layers, the upper surface portions being adjacent to the facing edges of the first and third semiconductor layers;

a second active semiconductor layer formed over the upper surface of the substrate such that it is disposed adjacent to the facing edges of the second and third semiconductor layers;

a gate insulating film formed over the resultant entire exposed surface of the substrate and all layers formed thereon, except for the contacts of the first and second semiconductor layers;

a first electrode formed over the gate insulating film and connected with the first semiconductor layer through the contact of the first semiconductor layer;

a second electrode formed over the gate insulating film and connected with the second semiconductor layer through the contact of the second semiconductor layer;

a first gate electrode formed over the gate insulating film and having a width smaller than the width between the first and third semiconductor layers, the first gate electrode being offset at its opposite edges with both the first and third semiconductor layers by a predetermined width; and a second gate electrode formed over the gate insulating film such that it is overlapped at its opposite edges with both the second and third semiconductor layers by a predetermined width.

7. A thin film transistor in accordance with claim 6, wherein the first semiconductor layer comprises a first metal layer formed over the substrate and provided with a first contact and a first amorphous silicon layer of a first conductivity type formed over one edge of the first metal layer and overlapped at its entire surface with the first active semiconductor layer, wherein the second semiconductor layer comprises a second metal layer formed over the substrate and provided with a second contact and a second amorphous silicon layer of the first conductivity type formed over one edge of the second metal layer and overlapped at its entire surface with the second active semiconductor layer, and wherein the third semiconductor layer comprises a third metal layer formed over the substrate and provided with a third contact and a third amorphous silicon layer of the first conductivity type formed over opposite edges of the third metal layer and overlapped at its entire surface with both the first and second active semiconductor layers.

8. A thin film transistor in accordance with claim 6, wherein the first active semiconductor layer comprises a polysilicon layer formed over the substrate and spaced from both the first and third semiconductor layers by a predetermined width, and a pair of ion implantation layers of a second conductivity type disposed at opposite sides of the polysilicon layer, and the second active semiconductor layer comprised of a single polysilicon film.

9. A thin film transistor comprising:

a substrate;

a first semiconductor layer formed over one side portion of an upper surface of the substrate and provided with at least one exposed edge, the first semiconductor layer also having a contact at its upper surface;

a second semiconductor layer formed over the other side portion of the upper surface of the substrate and provided with at least one exposed edge, the second semiconductor layer also having a contact at its upper surface;

a third semiconductor layer formed over the upper surface of the substrate between both side portions thereof and provided with at least one exposed edge;

a first active semiconductor layer formed over the upper surface of the substrate such that it is in contact with the facing edges of the first and third semiconductor layers;

a second active semiconductor layer formed over the upper surface of the substrate such that it is in contact with the facing edges of the second and third semiconductor layers;

a gate insulating film formed over the resultant entire exposed surface of the substrate and all layers formed thereon, except for the contacts of the first and second semiconductor layers;

a first electrode formed over the gate insulating film and connected with the first semiconductor layer through the contact of the first semiconductor layer;

a second electrode formed over the gate insulating film and connected with the second semiconductor layer through the contact of the second semiconductor layer;

a first gate electrode formed over the gate insulating film and having a width smaller than the width between the first and third semiconductor layers; and a second gate electrode formed over the gate insulating film such that it is disposed above the second active semiconductor layer.

10. A thin film transistor in accordance with claim 9, wherein the first semiconductor layer comprises a first metal layer formed over the substrate and provided with a first contact and a first amorphous silicon layer of a first conductivity type formed over one edge of the first metal layer to be at its one side surface in contact with the first active semiconductor layer, wherein the second semiconductor layer comprises a second metal layer formed over the substrate and provided with a second contact and a second amorphous silicon layer of a first conductivity type formed over one edge of the second metal layer to be at its one side surface in contact with the second active semiconductor layer, and wherein the third semiconductor layer comprises a third metal layer formed over the substrate and provided with a third contact and a third amorphous silicon layer of a first conductivity type formed over opposite edges of the third metal layer to be at its both side surfaces in contact with both the first and second active semiconductor layers, respectively.

* * * * *